US011131708B2

(12) United States Patent
Endo

(10) Patent No.: US 11,131,708 B2
(45) Date of Patent: Sep. 28, 2021

(54) ALIGNING MECHANISM AND ALIGNING METHOD

(71) Applicant: Tokyo Electron Limited, Tokyo (JP)

(72) Inventor: Tomoya Endo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/930,601

(22) Filed: May 13, 2020

(65) Prior Publication Data

US 2020/0379037 A1 Dec. 3, 2020

(30) Foreign Application Priority Data

May 31, 2019 (JP) .............................. JP2019-103182

(51) Int. Cl.
*G01R 31/26* (2020.01)
*G01R 31/20* (2006.01)
*G01R 31/28* (2006.01)
*G01R 1/04* (2006.01)

(52) U.S. Cl.
CPC ....... *G01R 31/2887* (2013.01); *G01R 1/0408* (2013.01)

(58) Field of Classification Search
CPC ........ G01R 31/02; G01R 31/20; G01R 31/26; G01R 31/28; G01R 31/2887; G01R 31/2891; G01R 31/2893; G01R 31/2865; G01R 1/04; G01R 1/067; G01R 1/073; H01L 21/68

See application file for complete search history.

(56) References Cited

U.S. PATENT DOCUMENTS

2013/0008581 A1\* 1/2013 Yuki ................. H01L 21/68728
156/60
2018/0275192 A1\* 9/2018 Yamada ............. G01R 31/2891

FOREIGN PATENT DOCUMENTS

JP    2016-046285    4/2016

\* cited by examiner

*Primary Examiner* — Neel D Shah
(74) *Attorney, Agent, or Firm* — IPUSA, PLLC

(57) ABSTRACT

An aligning mechanism according to one aspect of the present disclosure includes a mounting table on which a substrate is placed; a holding section configured to hold the mounting table from below; lifting pins configured to raise or lower the mounting table with respect to the holding section; and an aligner configured to support the holding section from below, and to change a position of the holding section relative to the lifting pins. In the holding section and the aligner, through-holes are formed such that the lifting pins can penetrate the through-holes.

7 Claims, 17 Drawing Sheets

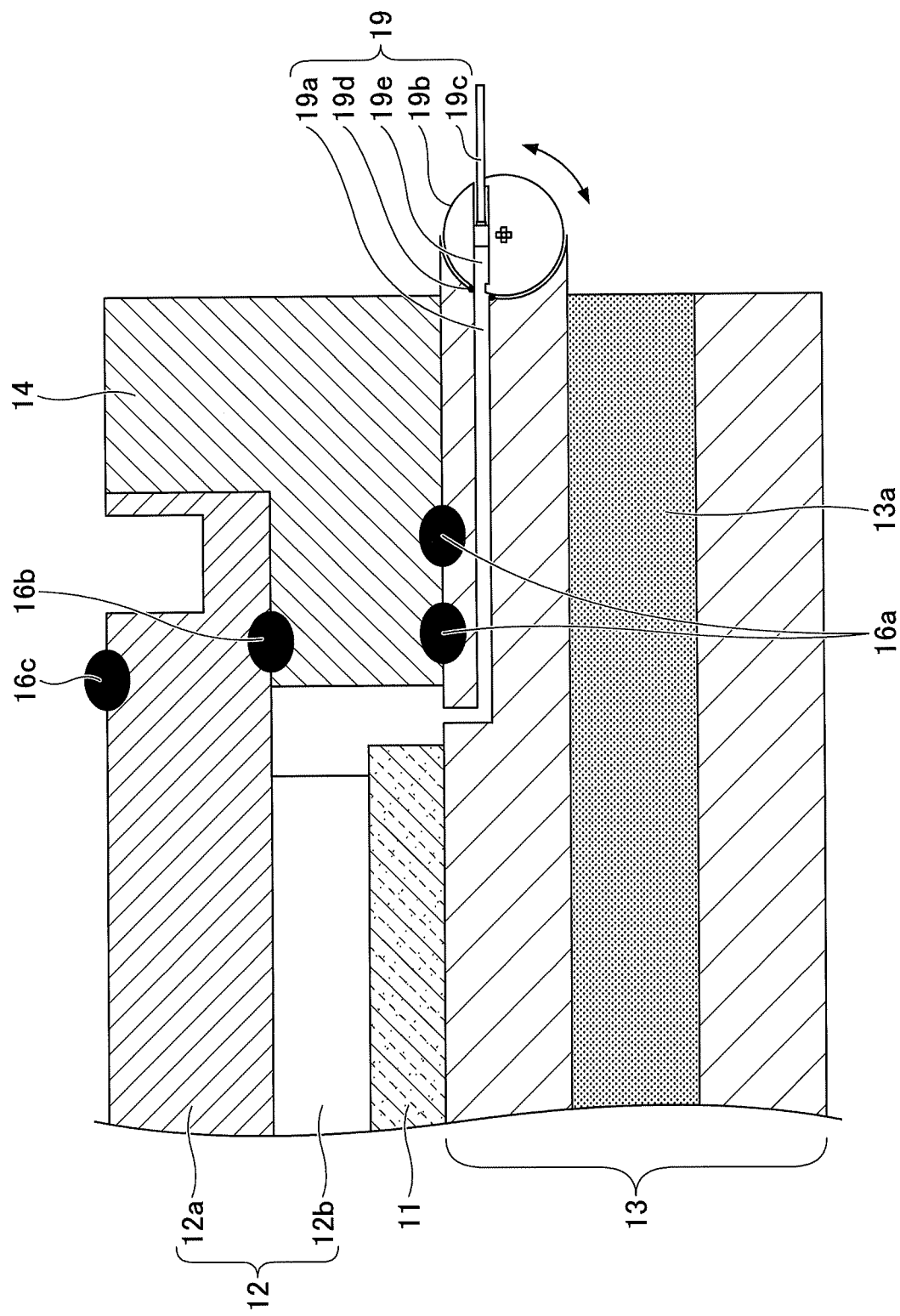

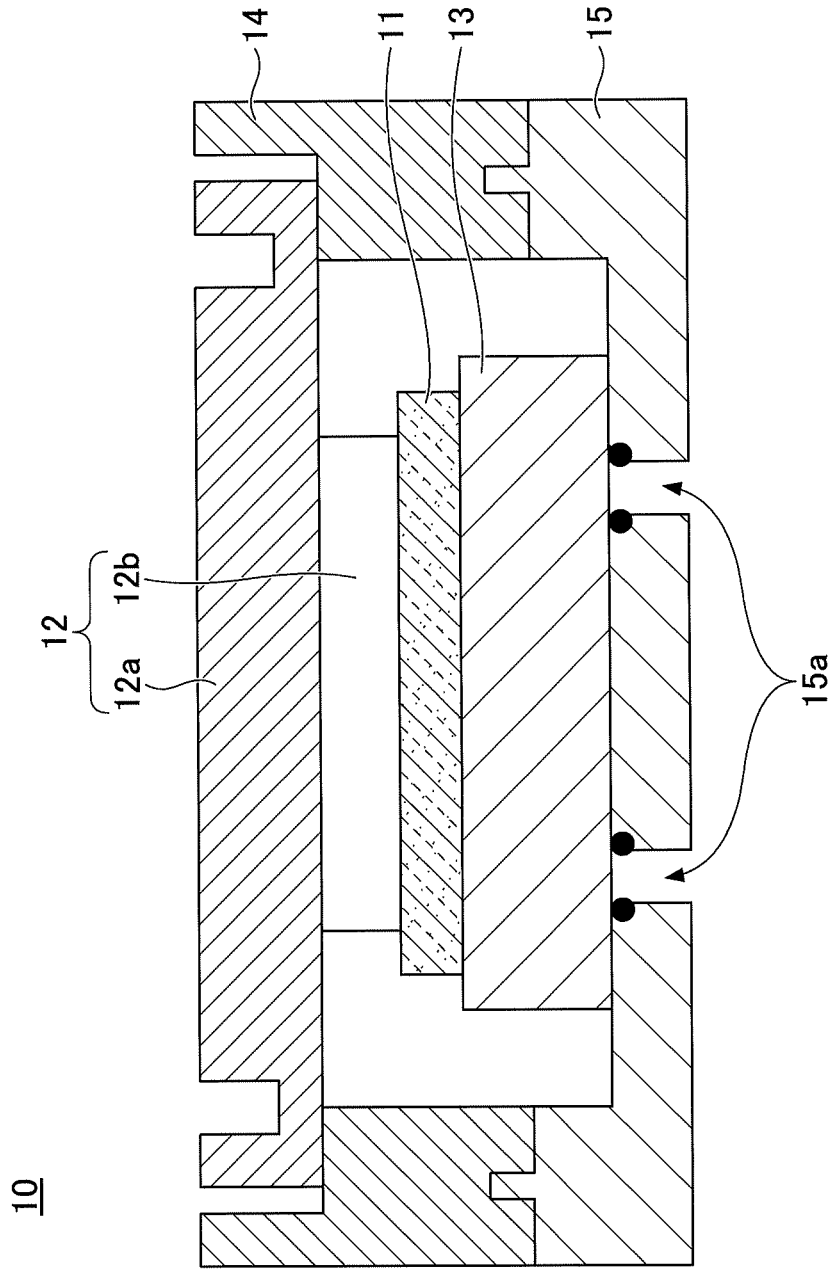

ent prevention mechanism;
ALIGNING MECHANISM AND ALIGNING METHOD

CROSS-REFERENCE TO RELATED APPLICATIONS

This patent application is based upon and claims priority to Japanese Patent Application No. 2019-103182 filed on May 31, 2019, the entire contents of which are incorporated herein by reference.

TECHNICAL FIELD

The present disclosure relates to an aligning mechanism and an aligning method.

BACKGROUND

There is known an inspection apparatus for performing inspection of a substrate. The inspection apparatus includes multiple inspection units, a shared transport robot or a mobile stage. In the inspection apparatus, while the transport robot or the mobile stage is loading a substrate to one of the inspection units, the other inspection units can perform inspection (see Patent Document 1 for example).

CITATION LIST

Patent Document

[Patent Document 1] Japanese Laid-open Patent Application Publication No. 2016-046285

SUMMARY

The present disclosure provides a technique for aligning a substrate for inspection.

An aligning mechanism according to one aspect of the present disclosure includes a mounting table on which a substrate is placed; a holding section configured to hold the mounting table from below; lifting pins configured to raise or lower the mounting table with respect to the holding section; and an aligner configured to support the holding section from below, and to change a position of the holding section relative to the lifting pins. In the holding section and the aligner, through-holes are formed such that the lifting pins can penetrate the through-holes.

BRIEF DESCRIPTION OF THE DRAWINGS

FIG. 7 is a diagram illustrating another example of the vacuum leak prevention mechanism of the shell;

FIG. 9 is a diagram illustrating another example of the shell;

DETAILED DESCRIPTION OF EMBODIMENTS

Figure 1:
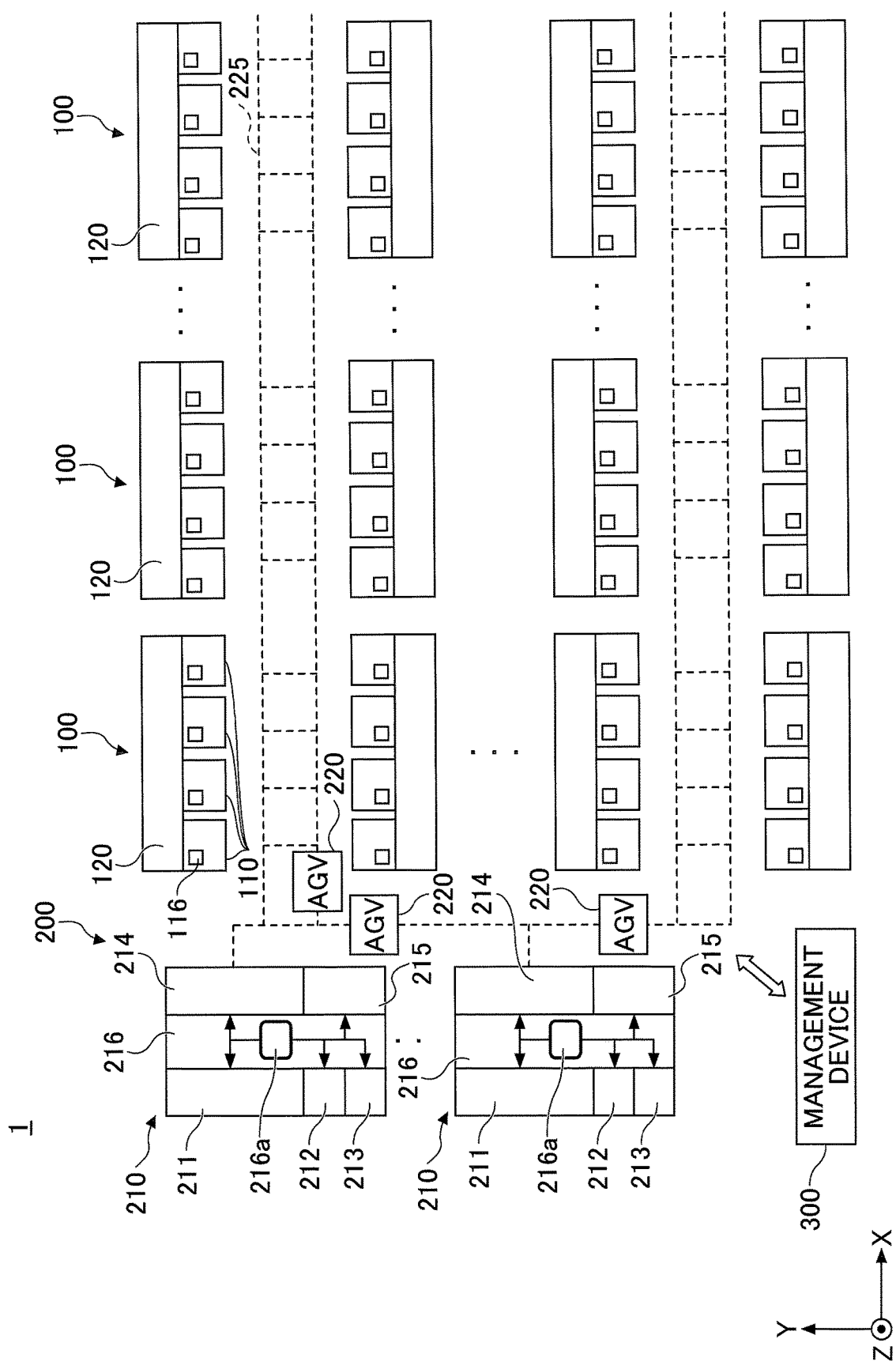
FIG. 1 is a diagram illustrating an example of the overall configuration of an inspection system.

Hereinafter, a non-limiting embodiment, of the present disclosure will be described with reference to the accompanying drawings. In all the accompanying drawings, the same or corresponding reference numerals shall be attached to the same or corresponding components and the description thereof will not be repeated.

First, an overall configuration of an inspection system of an embodiment will be described. The inspection system inspects various electrical characteristics of devices under test (DUTs) formed on an object to be inspected, by applying electric signals to the DUTs. An example of the object to be inspected includes a substrate such as a semiconductor wafer (hereinafter referred to as a "wafer").

FIG. 1 is a diagram illustrating an example of the overall configuration of an inspection system. As illustrated in FIG. 1, the inspection system 1 includes multiple inspection units 100, a transport system 200, and a management device 300.

The multiple inspection units 100 are arranged side by side in a lateral direction (X direction in FIG. 1) and in a longitudinal direction (Y direction in FIG. 1) in the same plane. Each of the inspection units 100 includes multiple inspection devices 110 and a chiller 120.

Each of the inspection devices 110 receives a shell 10 that is conveyed by a cassette unit 220 to be described below, and inspects the electrical characteristics of each DUT formed on a wafer 11. Each of the inspection devices 110 includes a controller 116 that controls the overall operation of the corresponding inspection device 110. Details of the shell 10 will be described below.

The chiller 120 cools stages 111 (see FIG. 12) in the inspection devices 110 by supplying a refrigerant, such as cooling water, to a refrigerant passage provided in the stages 111. In the example of FIG. 1, one chiller 120 is provided for four inspection devices 110. However, a separate chiller 120 may be provided for each inspection device 110.

The transport system 200 includes multiple loader units 210 and multiple cassette units 220.

The multiple loader units 210 are arranged in the longitudinal direction (Y direction in FIG. 1) in the same plane. Each of the loader units 210 includes a FOUP stocker 211, a probe card stocker 212, a needle polishing section 213, a shell stocker 214, an attaching/detaching section 215, and a transport section 216.

The FOUP stocker 211 is an area for storing vessels for transfer (i.e.: front opening unified pod [FOUP]) that accommodate multiple wafers 11. The FOUP stocker 211 is provided with, for example, multiple storage shelves for storing FOUPs. FOUPs are stored into the FOUP stocker 211 from outside of the inspection system 1. The FOUP stocker 211 is accessible by a transport device 216a in a transport section 216, which will be described below.

A probe card stocker 212 is an area for storing multiple probe cards 12. The probe card stocker 212 includes, for example, multiple storage shelves for storing probe cards 12. Probe cards 12 are placed into the probe card stocker 212 from outside of the inspection system 1. The probe card stocker 212 is accessible by the transport device 216a in the transport section 216, which will be described below.

The needle polishing section 213 is an area in which the tip of a probe 12b in the probe card 12 is polished, to repair the probe 12b to which dust or the like is attached. The needle polishing section 213 is provided with a needle polishing board for polishing the tip of the probe 12b, for example. The needle polishing section 213 is accessible by the transport device 216a in the transport section 216 to be described below.

The shell stocker 214 is an area for storing multiple shells 10. The shell stocker 214 includes, for example, multiple storage shelves for storing shells 10. The shell stocker 214 stores shells 10 having been assembled in the attaching/detaching section 215 and/or shells 10 having been inspected by the inspection unit 100. The shell stocker 214 is accessible by the transport device 216a in the transport section 216 and the cassette unit 220, which will be described below.

The attaching/detaching section 215 is an area for assembling the shell 10 into which the wafer 11 and the probe card 12 are integrated, and is also an area for dismantling the shell 10 into the wafer 11 and the probe card 12. In the attaching/detaching section 215, the wafer 11 is aligned by an aligner 215a (see FIGS. 10A to 10E) with the wafer 11 attracted and held on a mounting table 13, and the probes 12b of the probe card 12 are connected to respective electrodes of the DUTs by causing the probes 12b to contact the respective electrodes. As a result, the shell 10 is formed. Further, in the attaching/detaching section 215, a set of the wafer 11 and the probe card 12 that is integrated as the shell 10 is dismantled. The attaching/detaching section 215 is accessible by the transport device 216a in the transport section 216, which will be described below.

The transport section 216 is an area that conveys the shell 10, the wafer 11, and the probe card 12 between the areas. The transport section 216 is provided with the transport device 216a that conveys the shell 10, the wafer 11, and the probe card 12. The transport device 216a holds the shell 10, the wafer 11 and the probe card 12, and transports them between the areas. For example, the transport device 216a conveys the shell 10 between the attaching/detaching section 215 and the shell stocker 214. The transport device 216a conveys the wafer 11 between the FOUP stocker 211 and the attaching/detaching section 215. The transport device 216a conveys the probe card 12 between the probe card stocker 212, the needle polishing section 213, and the attaching/detaching section 215.

Each of the cassette units 220 is a mobile unit that stores multiple shells 10 and supplies the shells 10 to multiple inspection units 100. In the example of FIG. 1, each of the cassette units 220 transports the shell 10 between the shell stocker 214 in the loader unit 210 and the stage 111 of the inspection device 110. An example of the cassette unit 220 includes an automated guided vehicle (AGV). The cassette unit 220 runs automatically along a guide line 225, such as a magnetic tape laid on a floor.

The management device 300 controls operations of the multiple cassette units 220, based on position information of the multiple cassette units 220 measured by a positioning device (not illustrated). For example, the management device 300 determines which cassette unit 220 should be directed to the inspection device 110, based on the position information of the multiple cassette units 220 as measured by the positioning device. For example, the management device 300 may determine that the cassette unit 220 positioned closest to an inspection device 110 of interest should be directed to the inspection device 110. The management device 300 may also calculate an optimum route in a case in which the determined cassette unit 220 transports the shell 10, and may operate the cassette unit 220 to cause the cassette unit 220 to pass through the optimum route. The management device 300 may acquire the number of the shells 10 stored in a storage section 221 of each of the cassette units 220, and control operations of the multiple cassette units 220 based on the acquired number of the shells 10. As an example, the management device 300 may preferentially operate the cassette unit 220 that includes the most shells 10.

The positioning device is not limited to any particular type of positioning device, so long as it can measure and acquire position information of each of the multiple cassette units 220. An example of a suitable positioning device includes a set of position detecting sensors, each of which is disposed on the guide lines 225 and is capable of detecting passage of the cassette unit 220. Alternatively, the positioning device may be, for example, GNSS receivers, which are installed in the respective cassette units 220 to measure and acquire position information of the cassette units 220, by receiving a positioning signal from a GNSS (Global Navigation Satellite System) satellite such as a GPS satellite.

Figure 2:
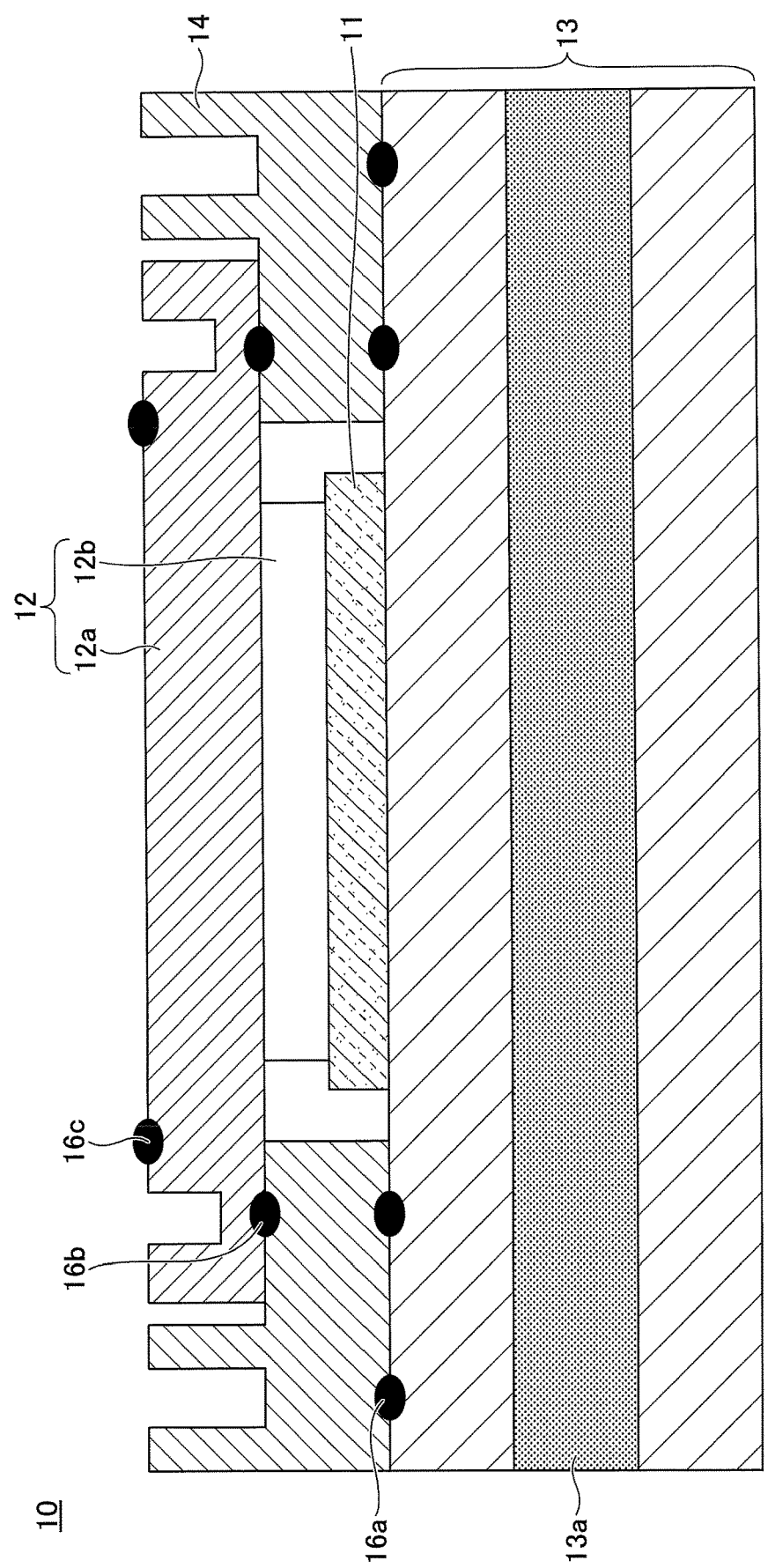
FIG. 2 is a diagram illustrating an example of a shell.

Next, an example of the configuration of the shell 10 will be described. FIG. 2 is a diagram illustrating an example of the shell 10.

As illustrated in FIG. 2, the shell 10 is a structure including the wafer 11, the probe card 12, the mounting table 13, and a holder 14.

Multiple DUTs (not illustrated) are formed on a surface of the wafer 11.

The probe card 12 is an example of an interconnect member, and includes a base 12a and multiple probes 12b. The base 12a is a plate-like member having multiple terminals (not illustrated) on an upper surface of the base 12a. The multiple probes 12b are an example of a contacting part, and are provided on the lower surface of the base 12a. The probes 12b can contact the electrodes of the DUTs formed on the wafer 11.

The mounting table 13 is used to place the wafer 11 on an upper surface of the mounting table 13. An example of the mounting table 13 is a vacuum chuck that draws and holds the wafer 11. Inside the mounting table 13 is a temperature adjusting section 13a for adjusting a temperature of the wafer 11 placed on the upper surface of the mounting table 13. The temperature adjusting section 13a may be, for example, a Peltier device.

The holder 14 is an example of a second holding section, and is provided on the mounting table 13 via a sealing member 16a. The holder 14 has an annular shape surrounding the wafer 11, and holds an outer periphery of the probe card 12. A sealing member 16b is provided on a surface at which the probe card 12 contacts the holder 14.

The shell 10 is positioned by positioning pins (not illustrated) while the shell 10 is attracted to the stage 111 of the inspection device 110, and multiple terminals on the upper surface of the probe card 12 are electrically connected to respective terminals on the inspection device 110. Also, on the upper surface of the probe card 12, a sealing member 16c is provided.

In the inspection system 1 according to the present embodiment described above, precise positioning (e.g., alignment) is performed at only one location (e.g., loader unit 210), and the shell 10 is assembled at the same location (e.g., loader unit 210). This facilitates transport (handling) of the wafer 11 (shell 10) among multiple devices, such as an inspection device and a test device.

In addition, as the shell 10 is sealed by the sealing members 16a and 16b and an interior of the shell 10 is decompressed, the DUTs formed on the wafer 11 and the probes 12b of the probe card 12 remain in contact with each other. By evacuating the interior of the shell 10, the interior is maintained in a decompressed state. However, as the shell 10 is transferred between the shell stocker 214 of the loader unit 210 and the stage 111 of the inspection device 110 by the cassette unit 220, it is difficult to always evacuate the interior of the shell 10. Therefore, for example, by using a "(2) vacuum leak prevention mechanism", which will be described below the pressure within the shell 10 is made to be lower than the exterior, so that the interior of the shell 10 is maintained in a decompressed state.

In addition, horizontal displacement of an upper member (for example, the holder 14) of the shell 10 with respect to a lower member (for example the mounting table 13) is avoided by, for example, a "(1) displacement prevention mechanism" which will be described later.

An overdrive amount in the shell 10 is managed by, for example, an "(5) overdrive amount adjusting mechanism" which will be described below. The overdrive amount means an amount of movement of the probe 12b by pressing the probe 12b toward a wafer 11, from a point at which the probe 12b first comes in contact with electrodes of DUTs formed on the wafer 11.

The alignment of the wafer 11 (electrodes of each DUT) to the probe card 12 (probes 12b) when assembling the shell 10 is realized by, for example, an "(3) aligning mechanism" to be described below. In this case, a motor drive is used for the alignment. Also, in addition to the motor, various motors are used in the inspection system 1. For the purpose of maintenance or the like of these motors, each of the motors is managed by, for example, a "(6) Maintenance support function" which will be described below.

The shell 10 is subjected to temperature control during transportation and inspection by, for example, a "(4) temperature adjustment mechanism" which will be described later.

The above-noted (1) to (6) will be described in detail below.

(1) Displacement Prevention Mechanism

Figure 3:
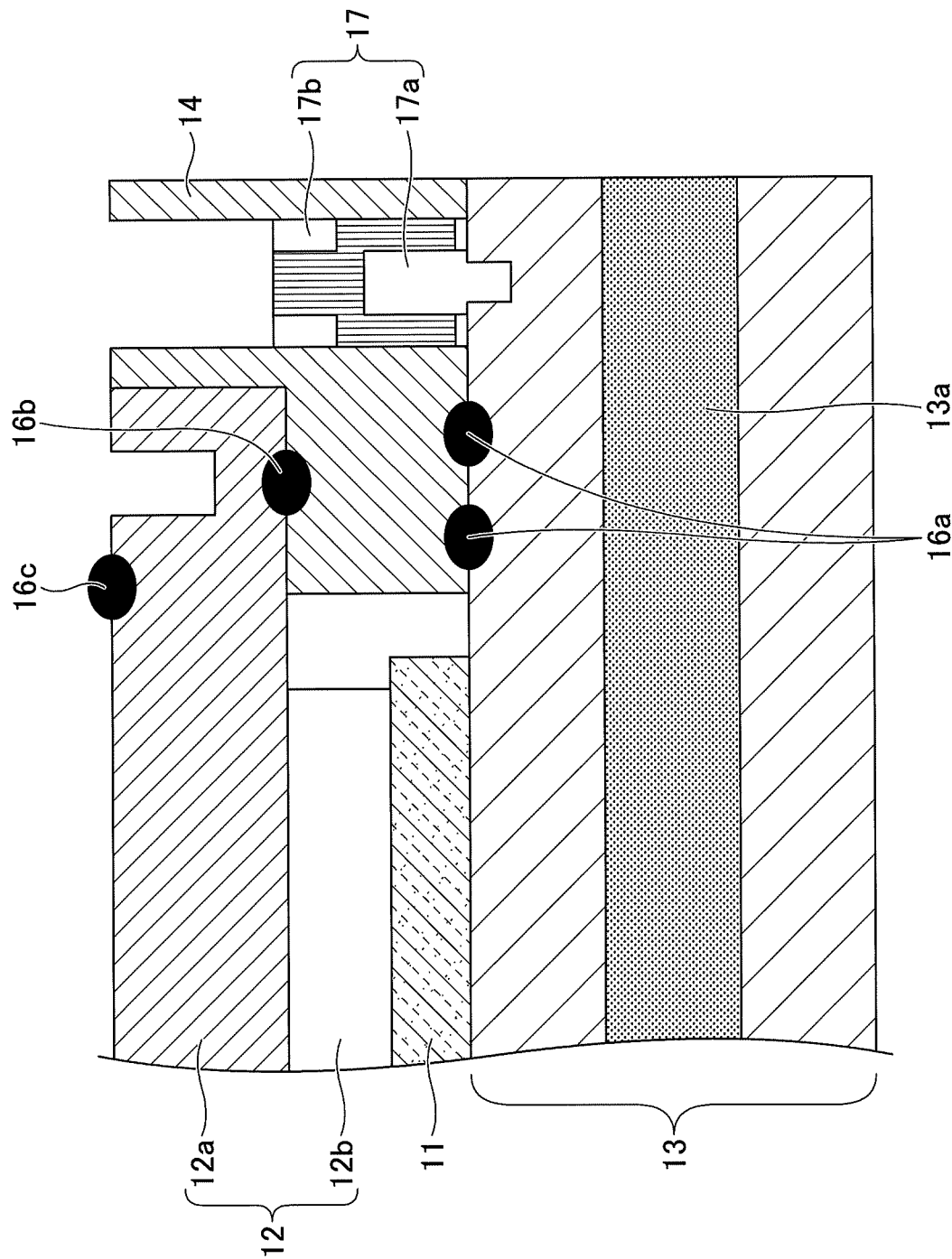
FIG. 3 is a cross-sectional view for explaining a displacement prevention mechanism.
Figure 4:
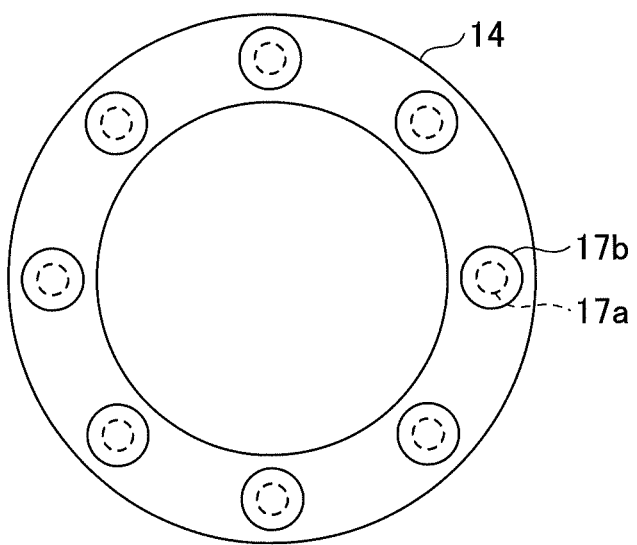
FIG. 4 is a top view for explaining the displacement prevention mechanism.
Figure 5A:
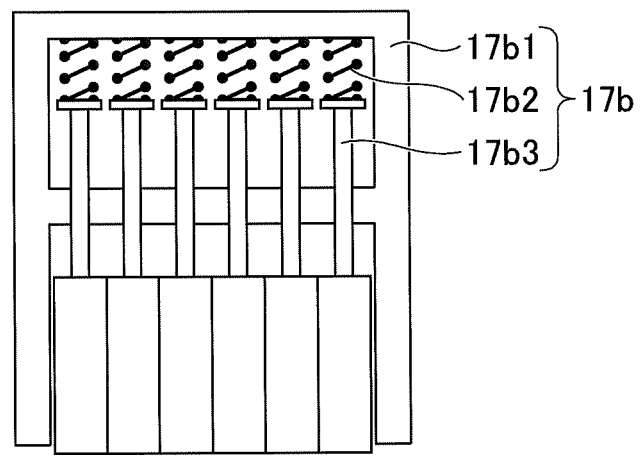
FIGS. 5A and 5B are enlarged views each illustrating a part of FIG. 3.
Figure 5B:
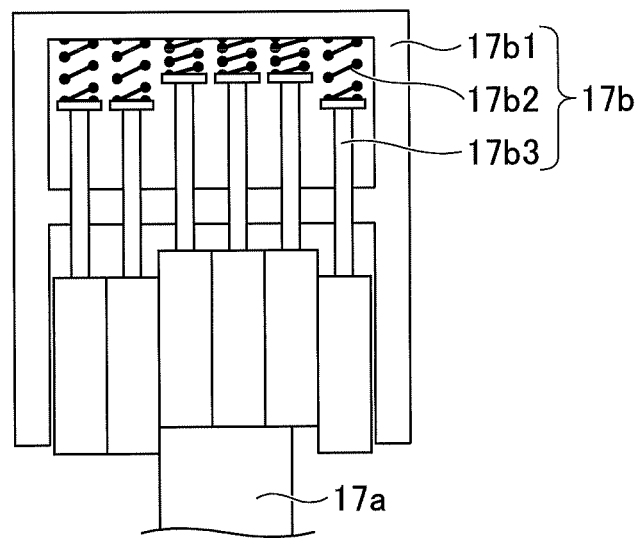

The mechanism for preventing horizontal displacement between the mounting table 13 and the holder 14 in the shell 10 (hereinafter referred to as a "displacement prevention mechanism") will be described, with reference to FIGS. 3 to 5B. FIGS. 3 and 4 are a cross-sectional view and a top view, respectively, for explaining the displacement prevention mechanism. FIGS. 5A and 5B are enlarged views each illustrating a part of FIG. 3.

As illustrated in FIGS. 3 and 4, the displacement prevention mechanism 17 includes positioning pins 17a and universal sockets 17b.

For example, as illustrated in FIG. 4, the multiple (e.g., eight) positioning pins 17a are arranged along a circumferential direction of the holder 14. Each of the positioning pins 17a is secured to the upper surface of the mounting table 13.

For example, each of the universal sockets 17b is provided at a position corresponding to a corresponding one of the positioning pins 17a in the horizontal direction, as illustrated in FIG. 4. That is, the multiple (e.g., eight) universal sockets 17b are arranged along the circumferential direction of the holder 14. Each of the universal sockets 17b is secured to the holder 14.

Each of the universal sockets 17b includes, as illustrated in FIG. 5A for example, a socket 17b1, multiple springs 17b2, and multiple pins 17b3.

The socket 17b1 is secured to the holder 14. The socket 17b1 has a shape of a cylinder having a ceiling, and has an opening at a bottom end of the socket 17b1. The socket 17b1 is larger than the positioning pins 17a in a planar view so as to cover the positioning pin 17a. The socket 17b1 accommodates the multiple springs 17b2, and secures an upper end of each of the multiple springs 17b2.

The upper end of each of the multiple springs 17b2 is secured to a ceiling surface of the socket 17b1. To a lower end of each of the multiple springs 17b2, a corresponding one of the pins 17b3 is attached. Each of the multiple springs 17b2 is configured to compress when the corresponding pin 17b3 is pressed upward.

The upper end of each of the multiple pins 17b3 is secured to the lower end of the corresponding spring 17b2. Each of the pins 17b3 has a diameter smaller than that of the positioning pin 17a.

In the aforementioned universal socket. 17b, as illustrated in FIG. 5B, when part of the multiple pins 17b3 are pressed upward by the positioning pin 17a, the springs 17b2 corresponding to the pressed pins 17b3 are compressed, and the pressed pin 17b3 moves upward. Meanwhile, because the spring 17b2 corresponding to the pin 17b3 that is not pressed by the positioning pin 17a does not compress, the pin 17b3 that is not pressed by the positioning pin 17a does not move upward. Accordingly, even if a force that displaces the positioning pin 17a in the horizontal direction is applied to the positioning pin 17a, the horizontal movement of the positioning pin 17a is restricted, because the side of the positioning pin 17a contacts the non-pressed pin 17b3. As described above, the positioning pin 17a is positioned by the universal socket 17b.

(2) Vacuum Leak Prevention Mechanism

Figure 6:
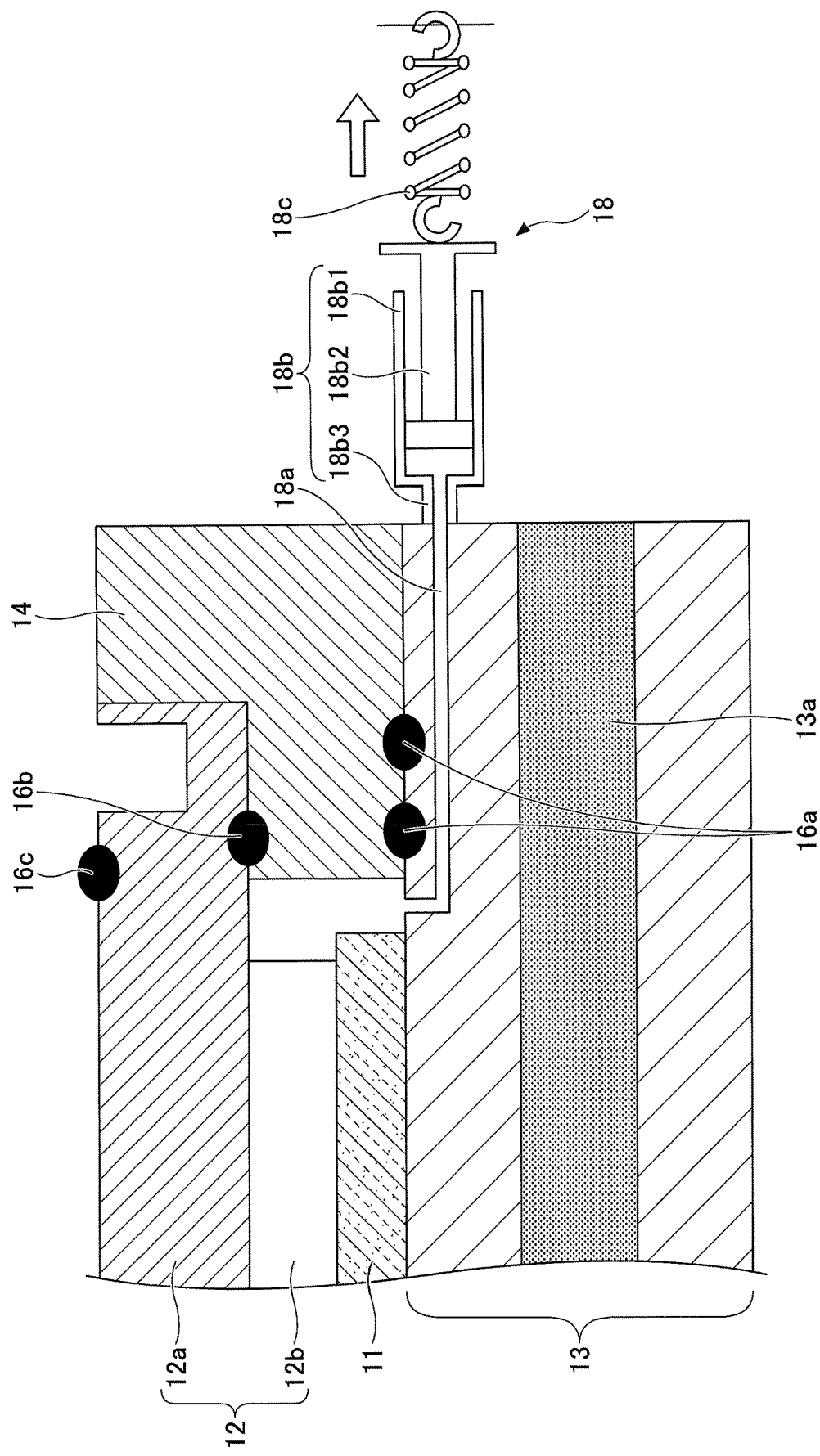
FIG. 6 is a diagram illustrating an example of a vacuum leak prevention mechanism of the shell.

An example of the mechanism for preventing variation in pressure inside the shell 10 caused by a vacuum leak and for maintaining a decompressed state in the shell 10 (hereinafter referred to as a "vacuum leak prevention mechanism") will be described with reference to FIG. 6. FIG. 6 is a diagram illustrating the example of the vacuum leak prevention mechanism of the shell 10.

As illustrated in FIG. 6, a vacuum leak prevention mechanism 18 includes a passage for decompression 18a, a syringe-type piston 18b, and a spring 18c.

The passage for decompression 18a is a gas flow passage formed inside the mounting table 13, and causes the interior of the shell 10 to communicate with the exterior.

The syringe-type piston 18b has a syringe (barrel) 18b1 and a piston 18b2. An outlet port 18b3 of the syringe (barrel) 18b1 communicates with the inside of the passage for decompression 18a. By the piston 18b2 being moved relative to the syringe (barrel) 18b1, the pressure inside the shell 10 is adjusted.

The spring 18c is secured at one end, and the other end of the spring 18c is attached to the piston 18b2. The spring 18c is configured to compress as the pressure inside the shell 10 increases.

According to the vacuum leak prevention mechanism 18, when the pressure inside the shell 10 increases, the spring 18c compresses and the piston 18b2 is pulled, thereby maintaining the decompressed state inside the shell 10.

Another example of the vacuum leak prevention mechanism will be described with reference to FIG. 7. FIG. 7 is a diagram illustrating another example of the vacuum leak prevention mechanism of the shell 10.

As illustrated in FIG. 7, a vacuum leak prevention mechanism 19 includes a passage for decompression 19a, a rotor 19b, and a rod 19c.

The passage for decompression 19a is a gas flow passage formed inside the mounting table 13 to cause the interior of the shell 10 to communicate with the exterior.

The rotor 19b is disposed on the side surface of the mounting table 13, so as to rotate with respect to the mounting table 13. To maintain airtightness, a sealing member 19d is provided between the side surface of the mounting table 13 and the rotor 19b. Inside the rotor 19b, a gas flow passage 19e that can communicate with the passage for decompression 19a is formed. As the rotor 19b rotates with respect to the mounting table 13, the state of the gas flow passage 19e is switched between one in which the gas flow passage 19e communicates with the passage for decompression 19a and one in which it does not communicate with the passage for decompression 19a. FIG. 7 illustrates the state in which the gas flow passage 19e communicates with the passage for decompression 19a.

The rod 19c is provided in the gas flow passage 19e, and the rod 19c can move while maintaining airtightness. In a state in which the passage for decompression 19a is in communication with the gas flow passage 19e, the pressure inside the shell 10 increases as the rod 19c is pushed toward the shell 10, and the pressure inside the shell 10 decreases as the rod 19c is pulled outward. In a state in which the passage for decompression 19a is not in communication with the gas flow passage 19e, if the rod 19c is pushed, gas in the gas flow passage 19e is discharged to the outside of the shell 10 through a gap between the mounting table 13 and the rotor 19b.

An example of an operation of the vacuum leak prevention mechanism 19 will be described with reference to FIGS. 8A to 8D. FIGS. 8A to 8D are diagrams illustrating the example of the operation of the vacuum leak prevention mechanism 19 of FIG. 7, which illustrates an example of the operation performed when the pressure inside the shell 10 has increased.

Figure 8A:
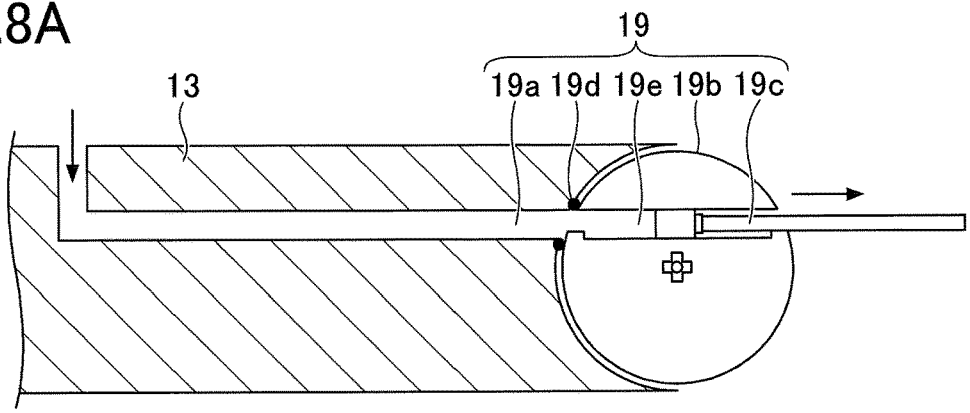
FIGS. 8A to 8D are diagrams illustrating an example of the operation of the vacuum leak prevention mechanism of FIG. 7.

First, when the internal pressure of the shell 10 is increased, as illustrated in FIG. 8A, a pulling operation is performed to pull the rod 19c while the passage for decompression 19a is in communication with the gas flow passage 19e. This substantially increases volume of the interior of the shell 10 and maintains a vacuum (decompressed state) of the interior of the shell 10. Such pulling operation may be performed by an operator or by a control unit provided inside or outside the shell 10. If the pulling operation is performed by the control unit, the control unit may monitor the pressure inside the shell 10 with a pressure sensor, and perform the pulling operation of the rod 19c when the pressure exceeds a threshold value. Alternatively, the control unit may pull the rod 19c when a predetermined period of time has elapsed.

Figure 8B:
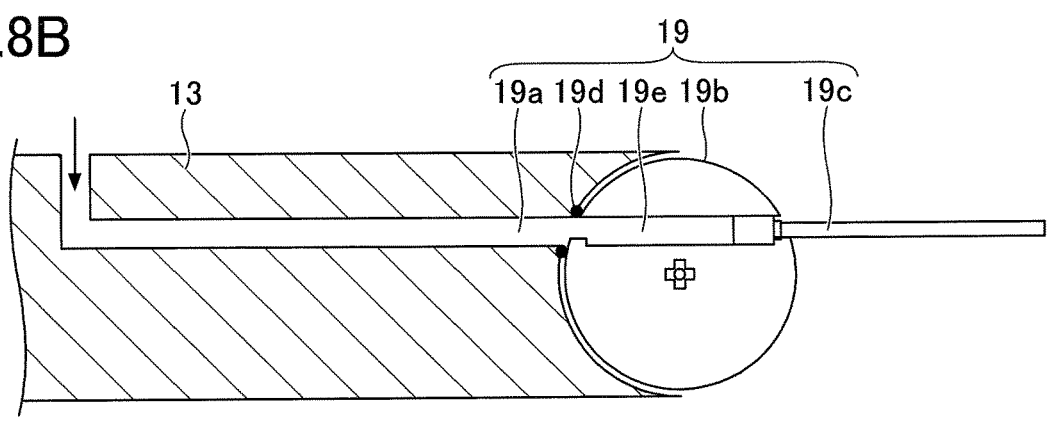
Figure 8C:
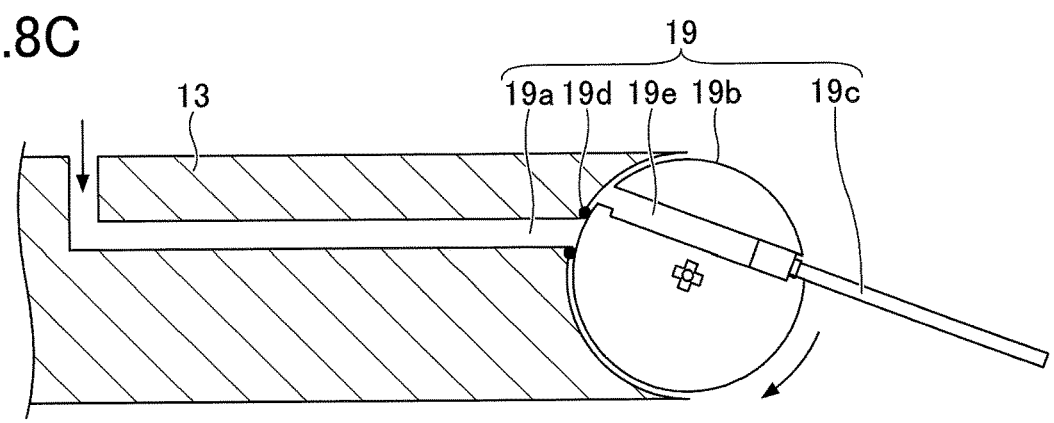

Subsequently, as illustrated in FIG. 8B, when the position of the rod 19c reaches a pulling limit, the rotor 19b is rotated in a first direction (for example, clockwise) as illustrated in FIG. 8C, to cut off the communication between the passage for decompression 19a and the gas flow passage 19e. This rotating operation is performed, for example, while a position of the rod 19c is fixed. This rotating operation may be performed by an operator or by the control unit.

Figure 8D:
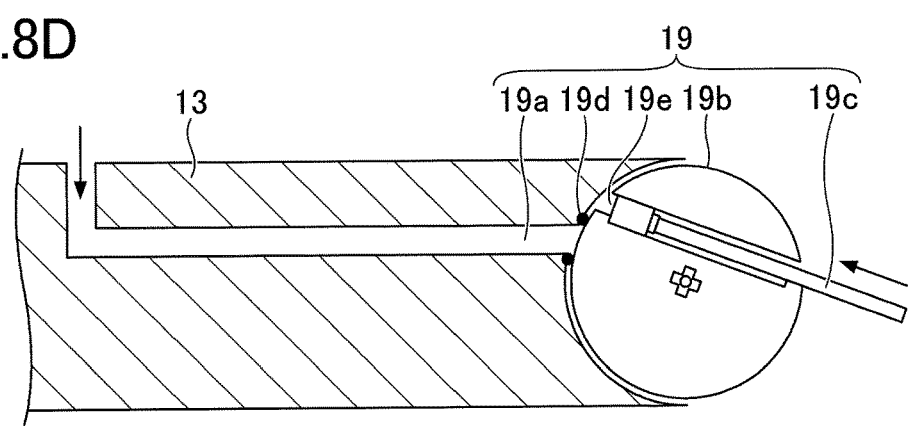

Next, as illustrated in FIG. 8D, an operation to push the rod 19c is performed while the rotation of the rotor 19b is stopped. Thus, gas in the gas flow passage 19e is discharged to the outside of the shell 10, through the gap between the mounting table 13 and the rotor 19b. Thereafter, the rotor 19b is rotated in a second direction (counterclockwise for example), which is opposite to the direction of the first direction, to cause the passage for decompression 19a to communicate with the gas flow passage 19e. This rotating operation is performed, for example, while the position of the rod 19c is fixed.

According to the vacuum leak prevention mechanism 19, if the pressure inside the shell 10 increases, the decompressed state in the shell 10 can be maintained by pulling the rod 19c to increase the volume inside the shell 10 substantially. Further, by repeating the above-described operations of rotating the rotor 19b and reciprocating the rod 19c, the vacuum state (decompressed state) in the shell 10 can be restored many times.

(3) Aligning Mechanism

Referring co FIGS. 9 and FIGS. 10A to 10E, a mechanism (hereinafter referred to as an "aligning mechanism") for aligning the wafer 11 to the probe card 12 when assembling the shell 10 will be described.

First, an example of a configuration of the shell 10 will be described with reference to FIG. 9. FIG. 9 illustrates another example of the shell 10.

The shell 10 illustrated in FIG. 9 is a structure having the wafer 11, the probe card 12, the mounting table 13, the holder 14, and a plate 15.

Multiple DUTs (not illustrated) are formed on a surface of the wafer 11.

The probe card 12 is an example of an interconnect member, and includes the base 12a and the multiple probes 12b. The base 12a is a plate-like member having multiple terminals (not illustrated) on an upper surface of the base 12a. The multiple probes 12b are an example of a contacting part, and are provided on the lower surface of the base 12a to allow contact with the electrodes of the DUTs formed on the wafer 11.

The mounting table 13 is used to place the wafer 11 on an upper surface of the mounting table 13. Inside the mounting table 13 is a temperature adjusting section (not illustrated) for adjusting a temperature of the wafer 11 placed on the upper surface of the mounting table 13. The temperature adjusting section may be, for example, a Peltier device.

The holder 14 is positioned to the plate 15, and is disposed on the plate 15 via a sealing member (not illustrated). In other words, a positional relationship between the holder 14 and the plate 15 is always constant. The holder 14 has an annular shape surrounding the wafer 11, and holds an outer periphery of the probe card 12. A sealing member (not illustrated) is provided at an interface between the probe card 12 and the holder 14.

The plate 15 is an example of a first holding section, and holds the mounting table 13 from below. The plate 15 is provided with multiple (e.g., three or more) through-holes 15a through which lifting pins 215p to be described below can pass.

Next, an example of an aligning operation by the aligning mechanism will be described with reference to FIGS. 10A to 10E. The positioning operation by the aligning mechanism described below is performed, for example, in the attaching/detaching section 215 of the loader unit 210. FIGS. 10A to 10E are diagrams illustrating an example of an operation performed by the aligning mechanism. In the attaching/detaching section 215, the aligner 215a, the lifting pins 215p, and a camera 215b are provided, which are major components of the aligning mechanism.

Figure 10A:
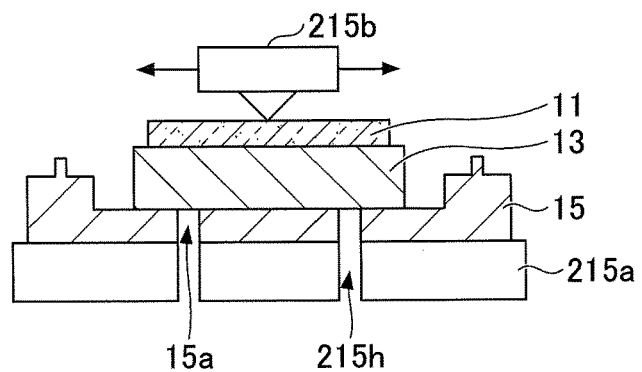
FIGS. 10A to 10E are diagrams illustrating an example of the operation performed by an aligning mechanism.

First, as illustrated in FIG. 10A, when the plate 15 is supported by the aligner 215a provided in the attaching/detaching section 215, the position information of the electrodes of the DUT formed on the wafer 11 is acquired by using the camera 215b provided in the attaching/detaching section 215.

Figure 10B:
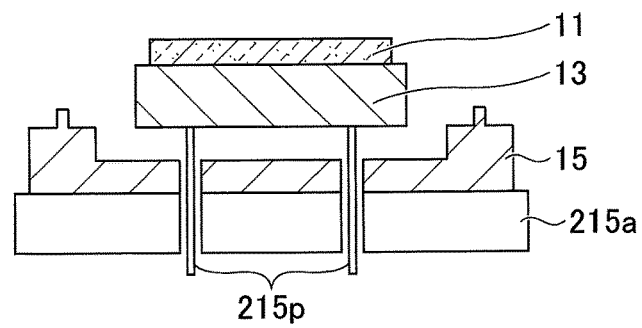

Subsequently, as illustrated in FIG. 10B, by raising the lifting pins 215p provided on the attaching/detaching section 215, the mounting table 13 on which the wafer 11 is placed is lifted, to separate the mounting table 13 from the plate 15.

Figure 10C:
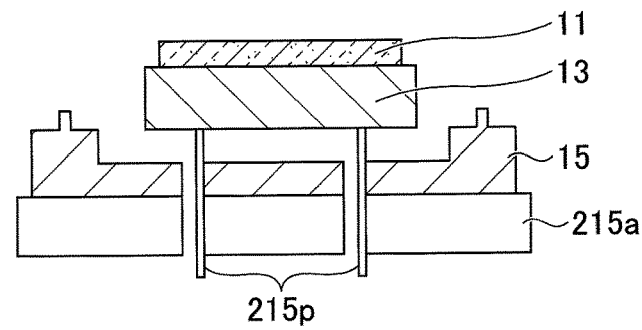

Subsequently, as illustrated in FIG. 10C, the aligner 215a is moved horizontally to change a position of the mounting table 13 relative to the aligner 215a in the horizontal direction. The amount of travel in the horizontal, direction of the aligner 215a is determined based on the position information of the electrodes of the DUT acquired by using the camera 215b and based on position information of the probe 12b of the probe card 12.

Figure 10D:
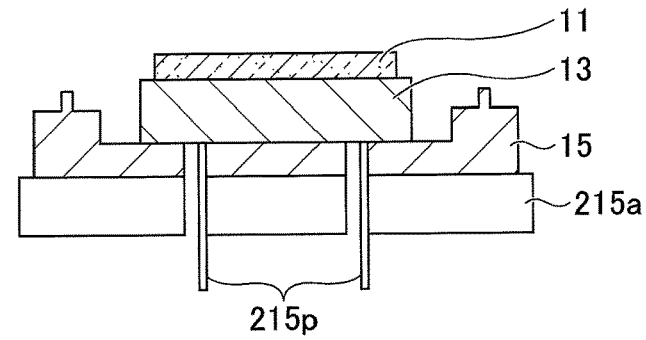

Subsequently, as illustrated in FIG. 10D, the mounting table 13 on which the wafer 11 is placed is mounted on the aligner 215a by lowering the lifting pins 215p.

Figure 10E:
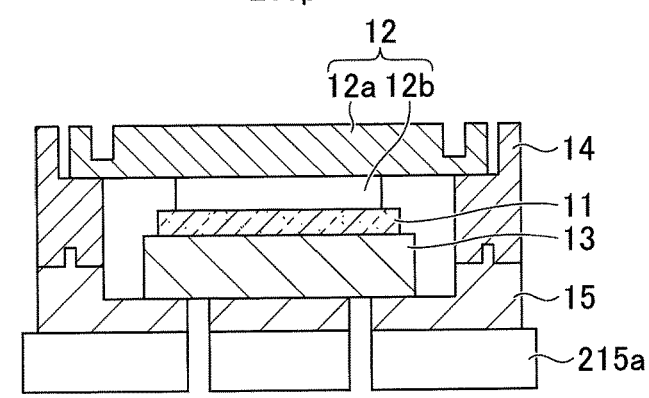

Subsequently, as illustrated in FIG. 10E, the holder 14 holding the probe card 12 is attached to the plate 15, and a space formed by the probe card 12, the holder 14, and the plate 15 is decompressed. As positioning pins are provided on the plate 15, the holder 14 can be attached to a position on the plate 15 that is determined by the positioning pins. Thus, the probes 12b of the probe card 12 respectively contact the electrodes of the DUTs formed on the wafer 11, and the shell 10 in which the wafer 11 and the probe card 12 are integrated is formed.

According to the aligning mechanism, in a system using the shell 10, the probe card 12 can be aligned to the wafer 11.

(4) Temperature Adjustment Mechanism

Figure 11:
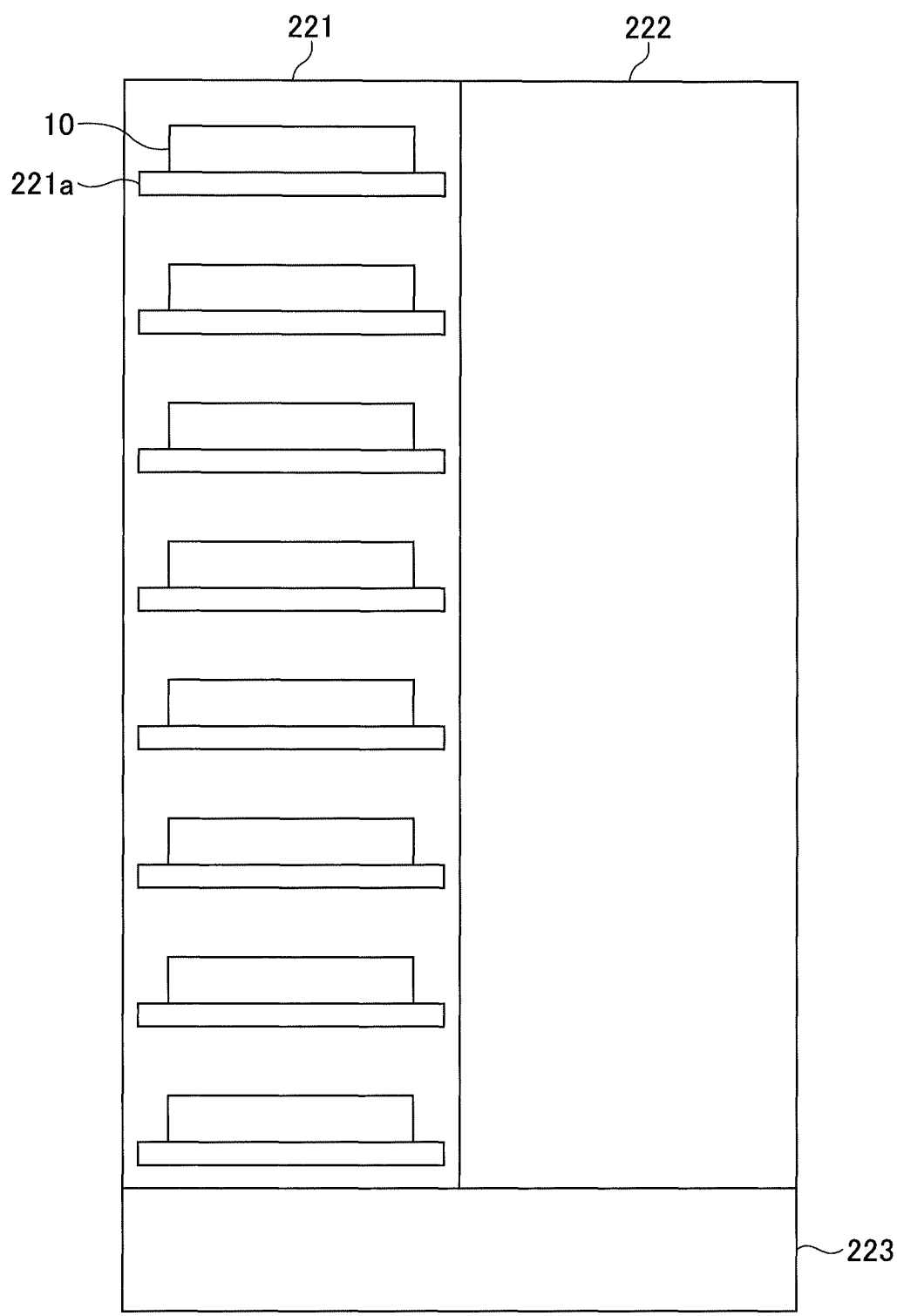
FIG. 11 is a diagram for explaining a first temperature adjustment mechanism.

Referring to FIG. 11, the cassette unit 220 that functions as a mechanism for adjusting a temperature of the wafer 11 (hereinafter, referred to as a "first temperature adjustment mechanism") while the shell 10 is transported will be described. FIG. 11 is a diagram for explaining the first temperature adjustment mechanism.

As illustrated in FIG. 11, the cassette unit 220 includes the storage section 221, a transfer section 222, and a driving section 223.

The storage section 221 stores multiple shells 10. The storage section 221 includes, for example, multiple mounting shelves 221a, and places the shell 10 on each of the mounting shelves 221a. The storage section 221 is a thermostatic chamber capable of maintaining a predetermined temperature inside, and adjusts a temperature of the multiple shells 10 stored in the storage section 221.

The transfer section 222 transfers the shell 10 between the storage section 221 and the multiple inspection units 100. The transfer section 222 includes a transfer robot (not illustrated) such as an articulated robot. At a position to pass the shells 10 between the storage section 221 and the shell stocker 214, the transfer robot holds a shell 10 and transfers the shell 10 from the storage section 221 to the shell stocker 214, or from the shell stocker 214 to the storage section 221. Also, at a position to pass the shells 10 between the storage section 221 and the inspection unit 100, the transfer robot holds a shell 10 and transfers the shell 10 from the storage section 221 to the inspection unit 100, or from the inspection unit 100 and the storage section 221.

The driving section 223 drives the cassette unit 220. The driving section 223 includes, for example, drive wheels, motors for driving the wheels and the transfer robot, and a battery that powers the motors. The driving section 223 may include a power receiving unit that can receive electric power by means of, for example, wireless power transfer or power transfer via a rail.

According to the cassette unit 220, in a case in which inspection is performed in the inspection unit 100 at a different temperature from room temperature, the temperature of the shell 10 (wafer 11) can be adjusted while the shell 10 is being transported by the cassette unit 220. Thus, the time required to adjust the temperature of the wafer 11 in the inspection unit 100 can be reduced. As a result, the period from a time when the shell 10 is transferred to the inspection unit 100 to a time to start the inspection of the wafer 11 can be reduced.

Figure 12:
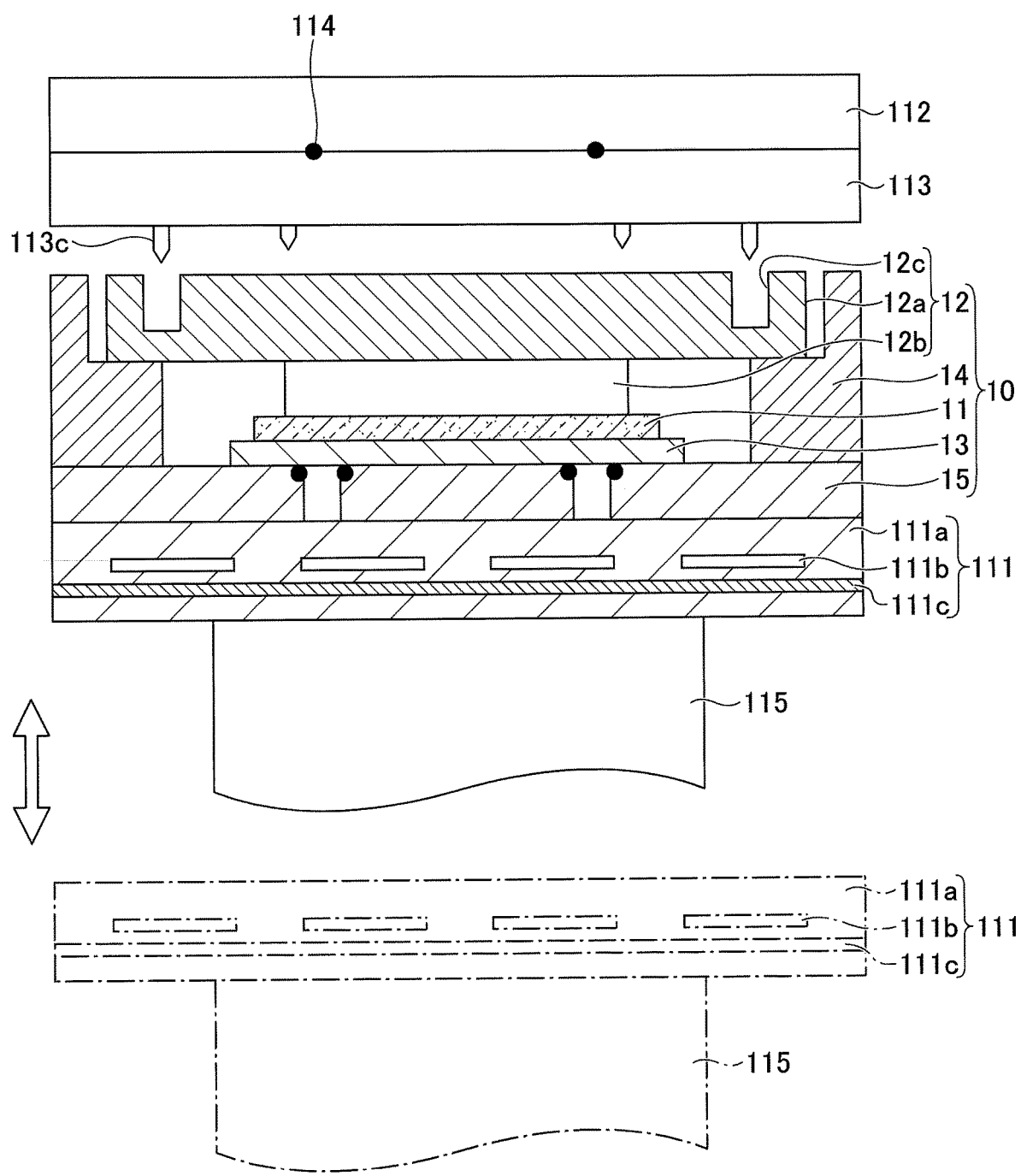
FIG. 12 is a diagram for explaining a second temperature adjustment mechanism.
Figure 13:
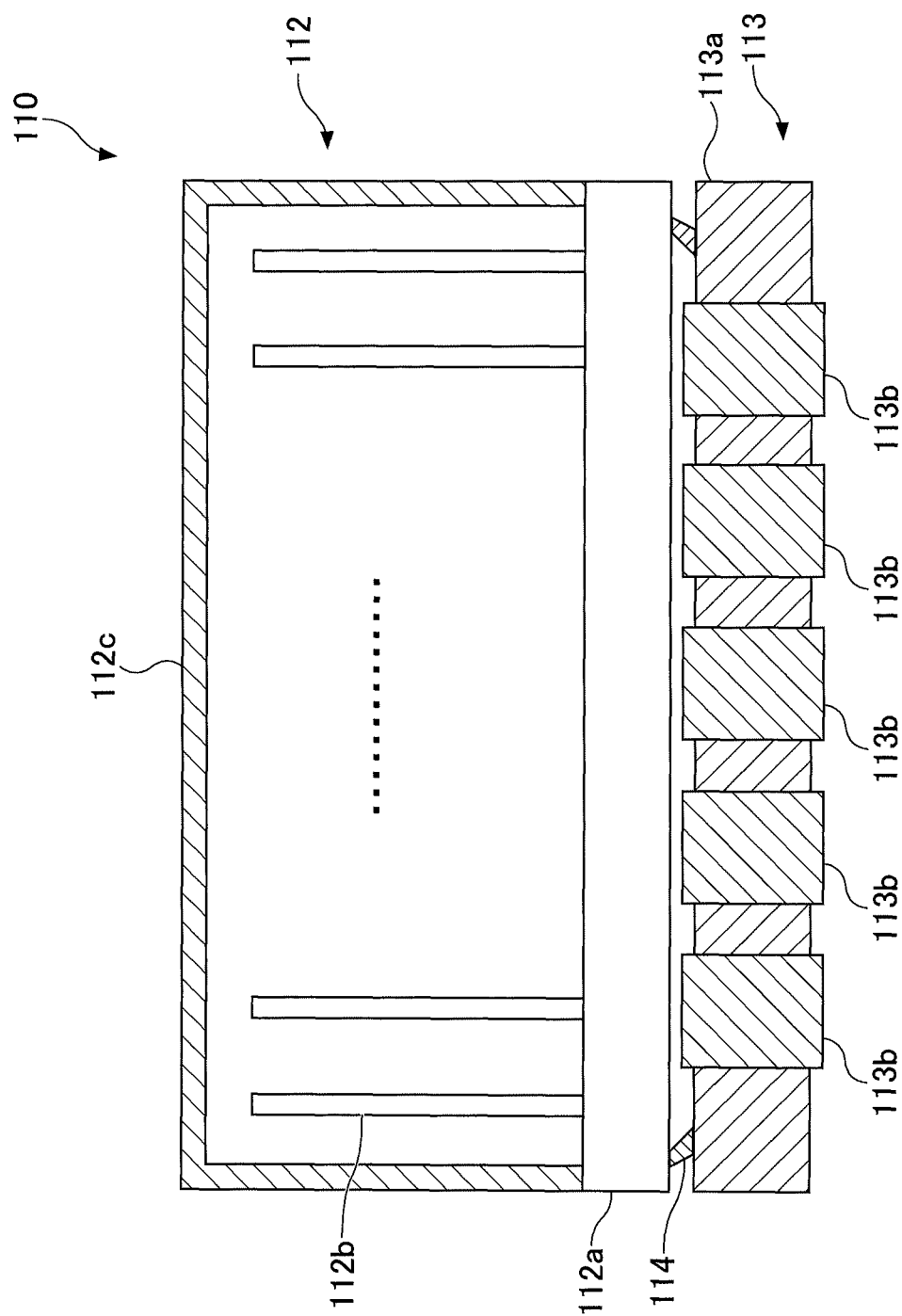
FIG. 13 is a diagram illustrating an example of a tester.

Next, the inspection device 110 that functions as a mechanism for adjusting the temperature of a wafer 11 (hereinafter referred to as a "second temperature adjustment mechanism") when inspecting electrical characteristics of each DUT formed on the wafer 11 of the shell 10 will be described with reference to FIGS. 12 and 13. FIG. 12 is a diagram for explaining the second temperature adjustment mechanism. FIG. 13 is a diagram illustrating an example of a tester.

As illustrated in FIG. 12, the inspection device 110 includes the stage 111, a tester 112, an intermediate connection member 113, and a lifting mechanism 115.

A shell 10 transported by the cassette unit 220 is placed on the stage 111. The stage 111 is configured to move up and down between a position for passing the shell 10 between the cassette unit 220 and the stage 111 (a position of the stage 111 illustrated by long dashed short dashed lines) and a position at which the shell 10 is inspected with the shell 10 contacted to the intermediate connection member 113 (a position of the stage 111 indicated by solid lines), by the lifting mechanism 115. The stage 111 includes a main body 111a, a refrigerant passage 111b, and a heater 111c. The main body 111a is approximately the same size as the shell 10, for example, in a planar view. The refrigerant passage 111b is embedded in the main body 111a and cools the shell 10 by circulating refrigerant from the chiller 120. The heater 111c is embedded in the main body 111a, and heats the shell 10 by electric power supplied from a power supply (not illustrated). Thus, the stage 111 functions as a second temperature adjustment mechanism to adjust the temperature of the wafer 11 when inspecting electrical characteristics of each DUT formed on the wafer 11 of the shell 10 by the inspection device 110.

The tester 112 includes a tester motherboard 112a, multiple inspection circuit boards 112b, and a housing 112c. The tester motherboard 112a is provided horizontally and includes multiple terminals (not illustrated) at the bottom. The multiple inspection circuit boards 112b are attached to respective slots in the tester motherboard 112a in an upright position. The housing 112c accommodates the inspection circuit boards 112b.

The intermediate connection member 113 is a member that electrically connects the tester 112 with the probe card 12, and includes a pogo frame 113a and pogo blocks 113b.

The pogo frame 113a is formed of a material of high strength, high stiffness, and a low thermal expansion coefficient, such as a NiFe alloy. The pogo frame 113a includes multiple rectangular fitting holes extending in a thickness direction, into which the pogo blocks 113b are fitted.

The pogo blocks 113b are positioned to the pogo frame 113a, to connect terminals of the tester motherboard 112a of the tester 112 with terminals of the base 12a of the probe card 12.

A sealing member 114 is provided between the tester motherboard 112a and the pogo frame 113a. By evacuating the space between the tester motherboard 112a and the intermediate connection member 113, the tester motherboard 112a is attracted by suction to the intermediate connection member 113 via the sealing member 114. Between the pogo frame 113a and the probe card 12, a sealing member (not illustrated) is also provided. By evacuating the space between the intermediate connection member 113 and the probe card 12, the probe card 12 is attracted by suction to the intermediate connection member 113 via the sealing member.

According to the inspection device 110, when receiving a shell 10 from the cassette unit 220, the shell 10 is lifted upward by the lifting mechanism 115, while the shell 10 is attracted by suction to the stage 111. At this time, as positioning pins 113c provided on the lower surface of the intermediate connection member 113 are engaged with positioning holes 12c provided on the upper surface of the probe card 12, the probe card 12 is positioned to the tester 112. Thus, multiple terminals on the upper surface of the probe card 12 are electrically connected to multiple terminals of the tester 112 via the intermediate connection member 113. Because the wafer 11 is in contact with the stage 111 via the mounting table 13 and the plate 15, the wafer 11 is cooled by a refrigerant circulating through the refrigerant passage 111b and/or heated by heat of the heater 111c, by thermal conduction.

(5) Overdrive Amount Adjusting Mechanism

Figure 14:
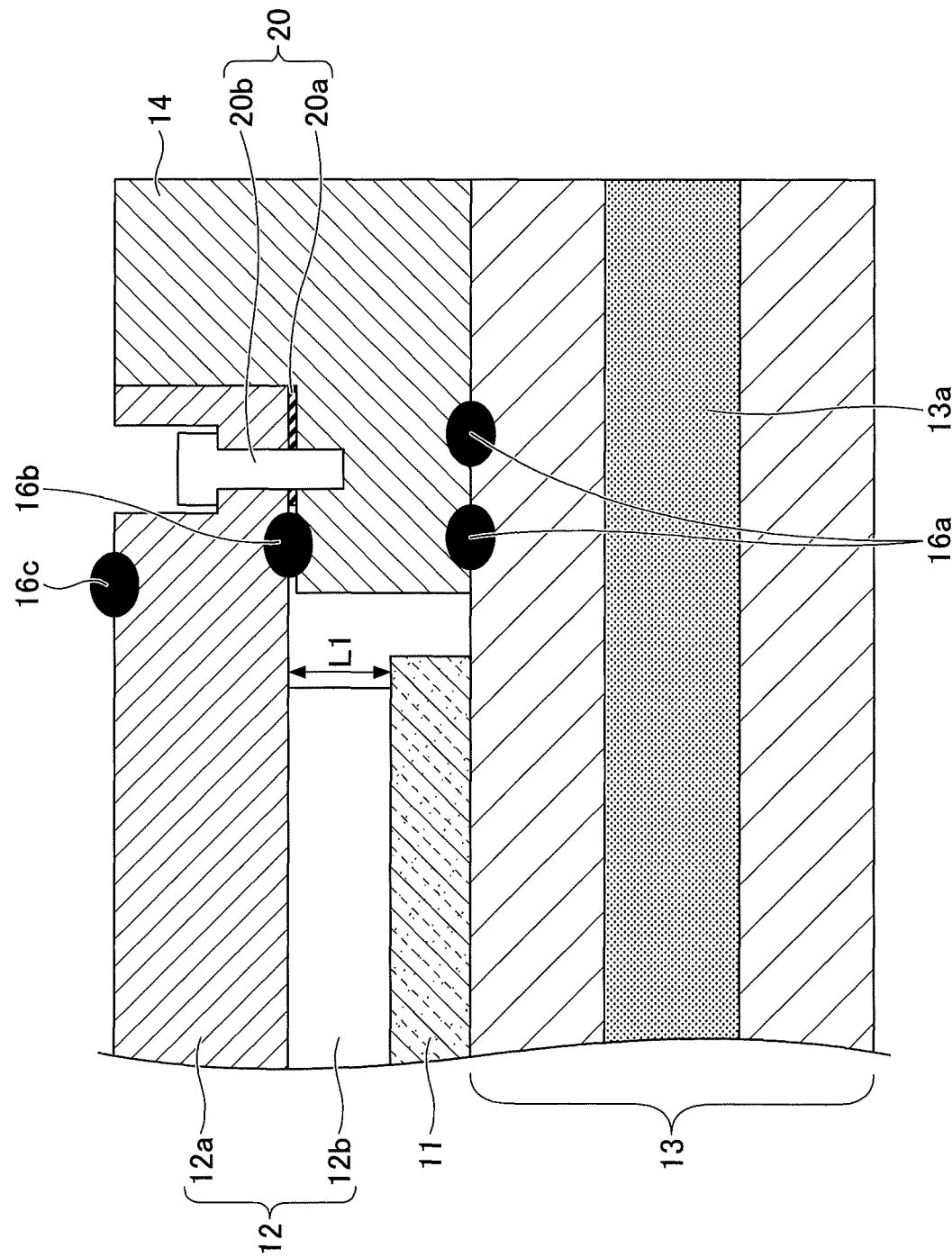
FIG. 14 is a diagram illustrating an example of an overdrive amount adjusting mechanism.

Referring to FIG. 14, an example of a mechanism for adjusting an overdrive amount (hereinafter referred to as an "overdrive amount adjusting mechanism") will be described. FIG. 14 is a diagram illustrating the example of the overdrive amount adjusting mechanism.

As illustrated in FIG. 14, the overdrive amount adjusting mechanism 20 includes a shim plate 20a and a fastener 20b.

Multiple shim plates 20a are provided between the probe card 12 and the holder 14 along a circumferential direction of the holder 14, to adjust a height of a gap between the probe card 12 and the holder 14. The shim plate 20a is, for example, a plate-like member, and by adjusting a thickness of the shim plate 20a, the gap corresponding to the thickness of the shim plate 20a is created between the probe card 12 and the holder 14.

The fastener 20b secures the probe card 12 to the holder 14 while the shim plate 20a is provided between the probe card 12 and the holder 14. An example of the fastener 20b includes a screw.

According to the overdrive amount adjusting mechanism 20, by adjusting the thickness of the shim plate 20a, a distance L1 between the upper surface of the wafer 11 and the lower surface of the base 12a of the probe card 12 is changed, and the overdrive amount is adjusted. For example, by making the shim plate 20a thicker, because the distance L1 between the upper surface of the wafer 11 and the lower surface of the base 12a of the probe card 12 increases, the overdrive amount can be reduced. Meanwhile, by making the shim plate 20a thinner, because the distance L1 between the upper surface of the wafer 11 and the lower surface of the base 12a of the probe card 12 decreases, the overdrive amount can be increased.

Figure 15:
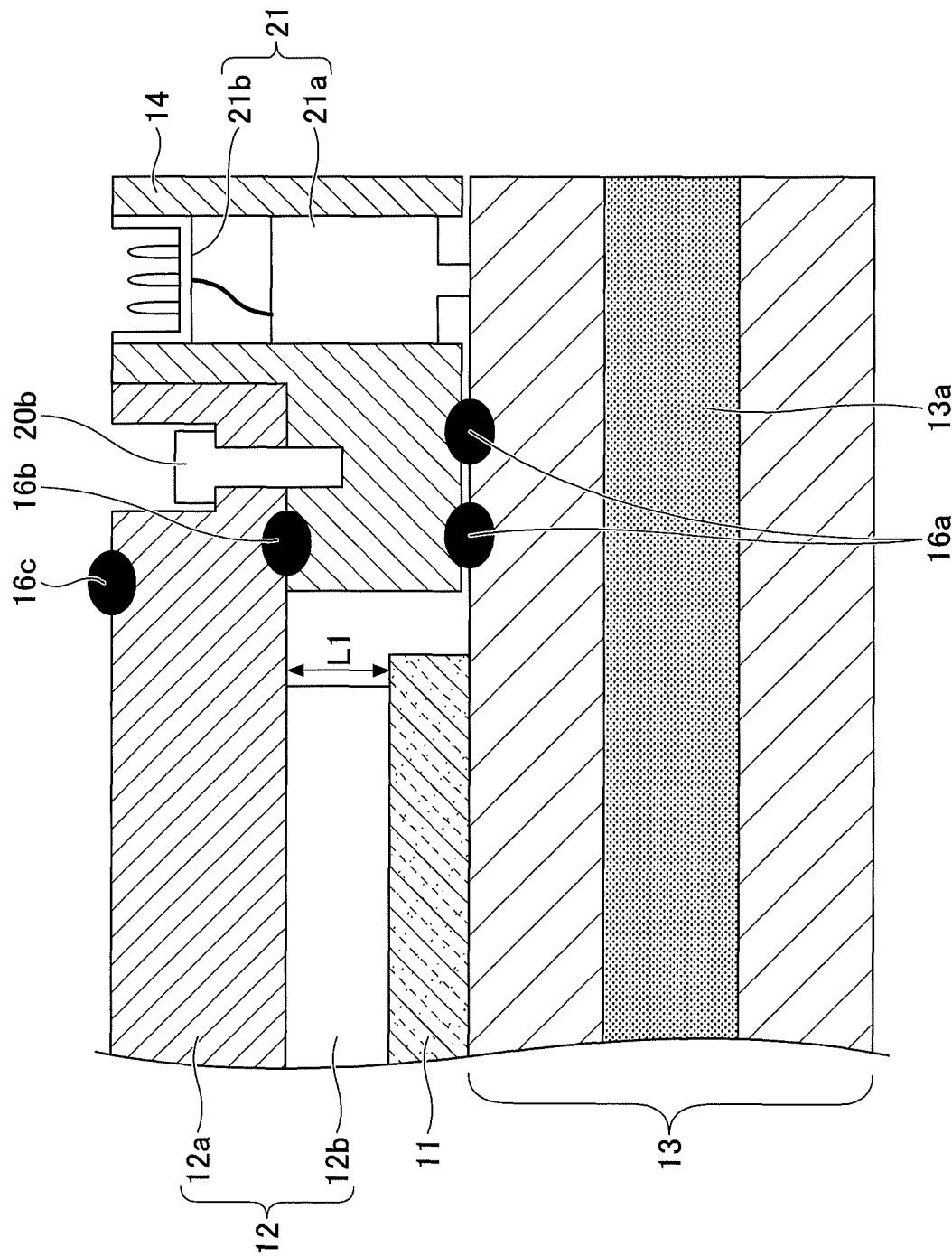
FIG. 15 is a diagram illustrating another example of the overdrive amount adjusting mechanism.

Another example of the overdrive amount adjusting mechanism will be described with reference to FIG. 15. FIG. 15 is a diagram illustrating another example of the overdrive amount adjusting mechanism.

As illustrated in FIG. 15, the overdrive amount adjusting mechanism 21 includes a piezoelectric actuator 21a and a power supply section 21b.

The piezoelectric actuator 21a is secured to the holder 14. When voltage is applied to the piezoelectric actuator 21a via the power supply section 21b, the piezoelectric actuator 21a slightly expands (for example, at an order of nanometers to micrometers). As the piezoelectric actuator 21a expands, the distance between the upper surface of the mounting table 13 and the lower surface of the holder 14 varies.

The power supply section 21b applies voltage to the piezoelectric actuator 21a, by being connected to a voltage supply terminal (not illustrated) that is provided externally.

According to the overdrive amount adjusting mechanism 21, when the holder 14 holding the probe card 12 is mounted on the mounting table 13 on which the wafer 11 is placed, voltage is applied to the piezoelectric actuator 21a through the power supply section 21b, to drive the piezoelectric actuator 21a. At this time, by applying different magnitudes of voltage to the piezoelectric actuator 21a, the amount of expansion of the piezoelectric actuator 21a varies, and the distance between the upper surface of the mounting table 13 and the lower surface of the holder 14 varies. As a result, because the distance L1 between the upper surface of the wafer 11 and the lower surface of the base 12a of the probe card 12 changes, the overdrive amount is adjusted.

For example, as the voltage applied to the piezoelectric actuator 21a is increased, the amount of expansion of the piezoelectric actuator 21a increases. As a result, the distance L1 between the upper surface of the wafer 11 and the lower surface of the base 12a of the probe card 12 increases, and the overdrive amount is reduced. In contrast, if the voltage applied to the piezoelectric actuator 21a is reduced, the amount of expansion of the piezoelectric actuator 21a decreases. As a result, the distance L1 between the upper surface of the wafer 11 and the lower surface of the base 12a of the probe card 12 decreases, and the overdrive amount increases.

(6) Maintenance Support Function

Figure 16:
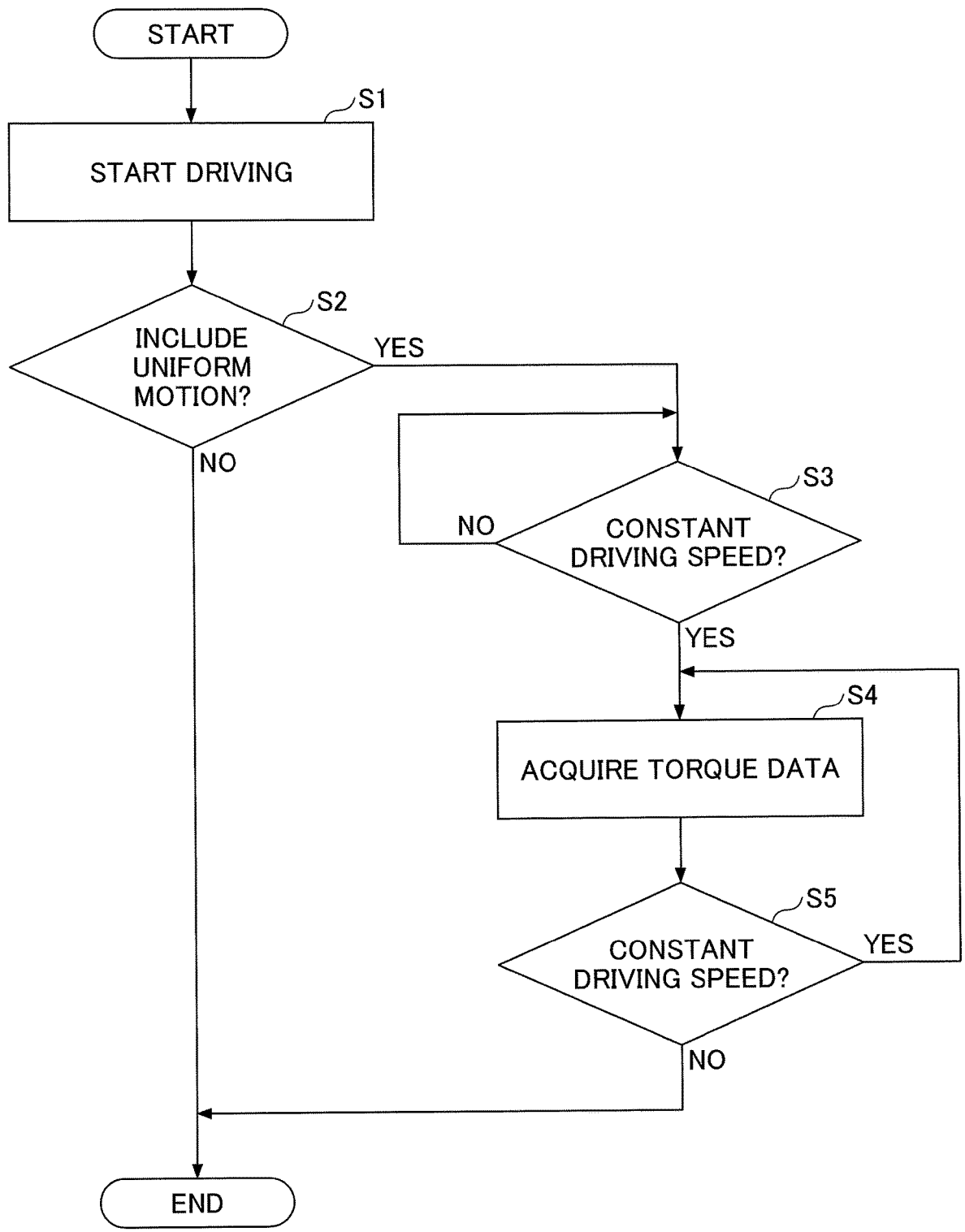
FIG. 16 is a flowchart illustrating an example of the process of a maintenance support function.
Figure 17:
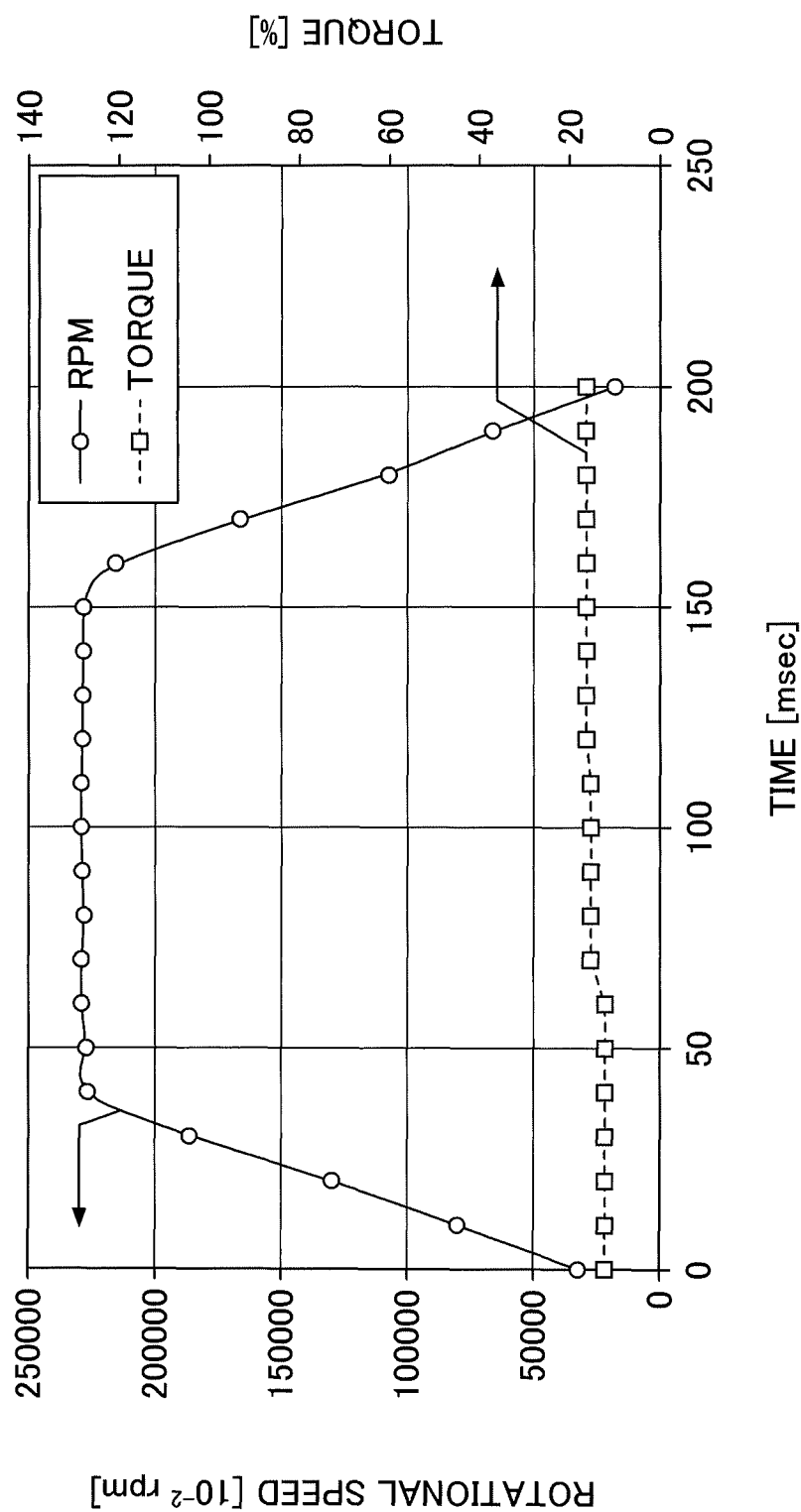
FIG. 17 is a graph for explaining an example of the maintenance support function.

Referring to FIGS. 16 and 17, a function to assist (support) determining maintenance timing of the inspection device 110 (hereinafter referred to as a "maintenance support function") will be described. The maintenance support function to be described below is performed by, for example, the controller 116 of the inspection device 110. However, for example, the maintenance support function may be performed by the management device 300 of the inspection system 1. FIG. 16 is a flowchart illustrating an example of the process of the maintenance support function.

In step S1, the controller 116 starts driving the motor based on a command to move the stage 111 by a predetermined distance.

In step S2, the controller 116 determines whether the drive of the motor when moving the stage 111 by the predetermined distance includes uniform motion, based on contents of the command. If it is determined in step S2 that the driving of the motor includes uniform motion, the process proceeds to step S3. On the other hand, if it is determined in step S2 that the driving of the motor does not include uniform motion, the process terminates.

In step S3, the controller 116 monitors driving speed of the motor by using, for example, a sensor attached to the motor, and determines whether the driving speed of the motor is constant based on a result of monitoring the driving speed of the motor. If it is determined in step S3 that the driving speed of the motor is constant, the process proceeds to step S4. However, in step S3, if it is determined that the driving speed of the motor is not constant (=accelerating), step S3 is repeatedly executed until the driving speed of the motor becomes constant.

In step S4, the controller 116 acquires torque data of the motor. In one example, the acquired torque data is passed, through the controller 116, to another management system in which the status of the inspection device 110 is determined. In another example, the controller 116 determines the wear status and timing of grease-up maintenance of parts that transmit driving force of the motor to the stage 111, such as a linear guide and a ball screw, based on the acquired torque data of the motor.

In step S5, the controller 116 determines whether the driving speed of the motor is constant based on the monitored driving speed of the motor. If the controller determines that the driving speed of the motor is constant in step S5, the process returns to step S4. Meanwhile, if the controller determines, in step S5, that the driving speed of the motor is not constant (=decelerating), the process terminates.

FIG. 17 is a graph for explaining an example of the maintenance support function. In FIG. 17, the horizontal axis indicates time [msec], a first (left) vertical axis indicates rotational speed of the motor [$10^{-2}$ rpm], and a second (right) vertical axis indicates torque of the motor [%]. In FIG. 17, a result of measurement of the rotational speed of the motor is illustrated by a solid line, and a result of measurement of the motor torque is illustrated by a dashed line.

As illustrated in FIG. 17, after the motor starts driving, the motor accelerates for a predetermined period of time (a period from 0 msec to 40 msec in FIG. 17). After the predetermined period of time, the motor rotates at a constant speed for a predetermined period of time (a period from 40 msec to 150 msec in FIG. 17), then the motor decelerates over a predetermined period of time (a period from 150 msec to 200 msec in FIG. 17), and stops.

If the torque data of the motor is acquired and monitored constantly while the motor is being driven, the amount of the data increases enormously, and may cause communication delay. Thus, in the present embodiment, the controller 116 performs the maintenance support functions described above. That is, the controller 116 stops acquiring the torque data of the motor when the motor is not rotating at constant speed, and acquires the torque data of the motor only when the motor is rotating at constant speed. This prevents the generation of an excessive amount of data. The maintenance support function may be applied to any systems using a motor. For example the maintenance support function can be used to determine maintenance timing of a typical prober.

Although the mechanisms and functions of (1) to (6) have been described in detail above, the above-described mechanisms and functions of (1) to (6) may be used alone, and two or more may be used in combination.

The embodiments described herein should be considered to be examples in ail respects and not limiting. The above embodiments may be omitted, substituted, or modified in various forms without departing from the appended claims and spirit thereof.

What is claimed is:

1. An aligning mechanism comprising:
a mounting table on which a substrate is placed;
a first holding section configured to hold the mounting table from below;
lifting pins configured to raise or lower the mounting table with respect to the first holding section; and
an aligner configured to support the first holding section from below, and to change a position of the first holding section relative to the lifting pins; wherein
through-holes are formed in the first holding section and the aligner, such that the lifting pins can pass through the through-holes.

2. The aligning mechanism according to claim 1, further comprising an interconnect member disposed at a predetermined position with respect to the first holding section, the interconnect member including a contacting part capable of electrically contacting electrodes of devices formed on the substrate.

3. The aligning mechanism according to claim 2, wherein the interconnect member is a probe card including probes configured to contact the electrodes of the devices.

4. The aligning mechanism according to claim 2, further comprising a second holding section configured to maintain the interconnect member at a constant position relative to the first holding section at all times.

5. The aligning mechanism according to claim 1, wherein the mounting table is a vacuum chuck.

6. A method of aligning a mounting table to a holding section, the method comprising:
placing, on the holding section, the mounting table on which a substrate is placed;
supporting, by an aligner, the holding section from below, while the mounting table is placed on the holding section;
separating the mounting table from the holding section by lifting the mounting table upward; and
changing a position of the mounting table relative to the holding section, by moving the aligner in a horizontal direction, while the mounting table is separated from the holding section upward.

7. The method according to claim 6, further comprising:
placing, after the changing, the mounting table on the holding section by moving the mounting table downward; and
disposing an interconnect member at a predetermined position with respect to the holding section, the interconnect member including a contacting part capable of electrically contacting electrodes of devices formed on the substrate.

* * * * *